United States Patent
Calcoen et al.

(10) Patent No.: US 10,449,573 B2
(45) Date of Patent: Oct. 22, 2019

(54) SORTING APPARATUS

(71) Applicants: Johan Calcoen, Wilse-Putkapel (BE); Peter Stulens, Zutendaal (BE)

(72) Inventors: Johan Calcoen, Wilse-Putkapel (BE); Peter Stulens, Zutendaal (BE)

(73) Assignee: Key Technology, Inc., Walla Walla, WA (US)

( * ) Notice: Subject to any disclaimer, the term of this patent is extended or adjusted under 35 U.S.C. 154(b) by 94 days.

(21) Appl. No.: 15/634,137

(22) Filed: Jun. 27, 2017

(65) Prior Publication Data

US 2018/0369871 A1 Dec. 27, 2018

(51) Int. Cl.
*B07C 5/36* (2006.01)
*H01L 31/024* (2014.01)
*B07C 5/34* (2006.01)
*G01J 1/42* (2006.01)
*G01J 1/44* (2006.01)
*H01L 25/16* (2006.01)
*H01L 31/107* (2006.01)
*B07C 5/342* (2006.01)
*G01J 1/02* (2006.01)
*H01L 29/772* (2006.01)

(52) U.S. Cl.
CPC ............ *B07C 5/3416* (2013.01); *B07C 5/342* (2013.01); *B07C 5/366* (2013.01); *G01J 1/0252* (2013.01); *G01J 1/4228* (2013.01); *G01J 1/44* (2013.01); *H01L 25/167* (2013.01); *H01L 31/024* (2013.01); *H01L 31/107* (2013.01); *B07C 2501/0018* (2013.01); *B07C 2501/0081* (2013.01); *G01J 2001/4453* (2013.01); *G01J 2001/4466* (2013.01); *H01L 29/772* (2013.01)

(58) Field of Classification Search
CPC ....... H01L 31/02027; G01J 2001/4466; B07C 5/366; B07C 2501/0018
See application file for complete search history.

(56) References Cited

U.S. PATENT DOCUMENTS

2001/0023944 A1* 9/2001 Maruyama ........ H01L 31/02027
257/53
2014/0262966 A1* 9/2014 Cadieux, Jr. ............ B07C 5/342
209/3.3

OTHER PUBLICATIONS

Notification of Transmittal of the International Search Report and the Written Opinion of the InternationalSearching Authority, or the Declaration, PCT/US18/14375, dated Apr. 6,2018.

* cited by examiner

*Primary Examiner* — Thanh Luu
(74) *Attorney, Agent, or Firm* — Randall Danskin P.S.

(57) ABSTRACT

A sorting apparatus is described and which includes a selectively heated avalanche photodiode (APD) which is maintained at a predetermined temperature and which further demonstrates a higher gain and signal-to-noise ratio with greater stability at a predetermined temperature for enhancing sorting efficiency.

16 Claims, 3 Drawing Sheets

US 10,449,573 B2

SORTING APPARATUS

TECHNICAL FIELD

The present invention relates to a sorting apparatus, and more specifically to a sorting apparatus which utilizes an avalanche photodiode (APD), and which is further maintained at a predetermined temperature, and which demonstrates a higher gain and signal-to-noise ratio with greater stability, during operation.

BACKGROUND OF THE INVENTION

The manufacturers of high speed, mass-flow food sorting devices have continually endeavored to develop devices, and related systems to readily identify acceptable and unacceptable objects or products travelling within a stream of products to be sorted, thus allowing a sorting apparatus to identify, and then remove, undesirable objects so as to produce a homogeneous, resulting product stream which is more useful for food processors, and/or other end users. Heretofore, attempts which have been made to enhance the ability to image objects effectively, in real time, have met with somewhat limited success.

While many advancements have been made in this technology area, there remains a long felt need to increase the ability for these previous sorting devices to detect electromagnetic radiation in selected bands such as in the near infrared spectrum as well as increase the sensitivity of detectors which detect, for example, red light and also emissions such as fluorescence which may be emitted by chlorophyll which is present in in various varieties of agricultural products which are being inspected.

While the use of prior art photomultiplier tubes to detect electromagnetic radiation have worked with some degree of success, it has long been recognized that photomultiplier tubes also display high noise or interference in the electrical signals that they generate. Still further, the bandwidth within which the typical photomultiplier tubes operate is considered relatively large. Consequently, developers of the aforementioned prior art sorting devices have sought an alternative to the use of photomultiplier tubes, and which may be useful in detecting the aforementioned bands of light in a manner not possible, heretofore. A sorting apparatus which avoids the detriments associated with the various prior art teachings and practices previously used in the art, is the subject matter of the present application.

SUMMARY OF THE INVENTION

A first aspect of the present invention relates to a sorting apparatus which includes an inspection station for receiving a product stream which is to be sorted; an electromagnetic radiation assembly positioned adjacent to the inspection station, and which, when energized, generates a predetermined band of electromagnetic radiation, and which further is emitted in the direction of the inspection station, and wherein the emitted electromagnetic radiation is reflected, at least in part, from the product stream passing through the inspection station; an electromagnetic radiation detector for detecting the electromagnetic radiation which is emitted by the electromagnetic radiation assembly, and wherein the electromagnetic radiation detector includes an avalanche photodiode (APD) which is maintained at a predetermined temperature, and which further demonstrates a higher gain, and signal-to-noise ratio with greater stability at the predetermined temperature; and a controller operably and controllably coupled to each of the electromagnetic radiation assembly, and detector, respectively.

Still another aspect of the present invention relates to a sorting apparatus which includes an inspection station for receiving a product stream which is to be sorted; an electromagnetic radiation assembly positioned adjacent to the inspection station, and which, when energized, generates a predetermined band of electromagnetic radiation, and which further is emitted in the direction of the inspection station, and wherein the emitted electromagnetic radiation is reflected, at least in part, from the product stream passing through the inspection station; an electromagnetic radiation detector for detecting the electromagnetic radiation which is emitted by the electromagnetic radiation assembly, and wherein the electromagnetic radiation detector includes a selectively heated avalanche photodiode (APD) which is maintained at a predetermined substantially constant temperature which is greater than a given maximum ambient temperature, and which further demonstrates a higher gain, and signal-to-noise ratio, with greater stability at the predetermined substantially constant temperature, and wherein the APD is made integral with a printed circuit board having top and bottom surfaces, and wherein a first layer of a heat conductive material is deposited on the top surface of the printed circuit board, and a transistor is operably mounted on the first layer of heat conductive material, and is selectively energized, and wherein the transistor, when selectively energized, generates heat energy which is received, and conductively transmitted by the first layer of heat conductive material, and wherein vias are formed in the printed circuit board, and extend between the top and bottom surfaces of the printed circuit board, and the first layer of heat conductive material extends through the vias, and transmits the generated heat energy, at least in part, to the bottom surface, and wherein the APD is mounted on the bottom surface of the printed circuit board, and the heat energy generated by the transistor is conductively transmitted through the vias, to the APD; a temperature sensor mounted in heat sensing relation relative to the second layer of heat conductive material; an electrical circuit operably, and controllably coupled with each of the transistor, and the temperature sensor, and wherein the electrical circuit selectively, electrically energizes the transistor so as to cause the transistor to generate a sufficient amount of heat energy which is imparted to the first layer of heat conducting material, and then conductively transmitted to the second layer of heat conducting material, and which maintains the APD at the predetermined substantially constant temperature which is greater than a given maximum ambient temperature; and a controller operably and controllably coupled to each of the electromagnetic radiation assembly, APD, temperature sensor, and electrical circuit, respectively.

BRIEF DESCRIPTION OF THE DRAWINGS

Preferred embodiments of the invention are described below, with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
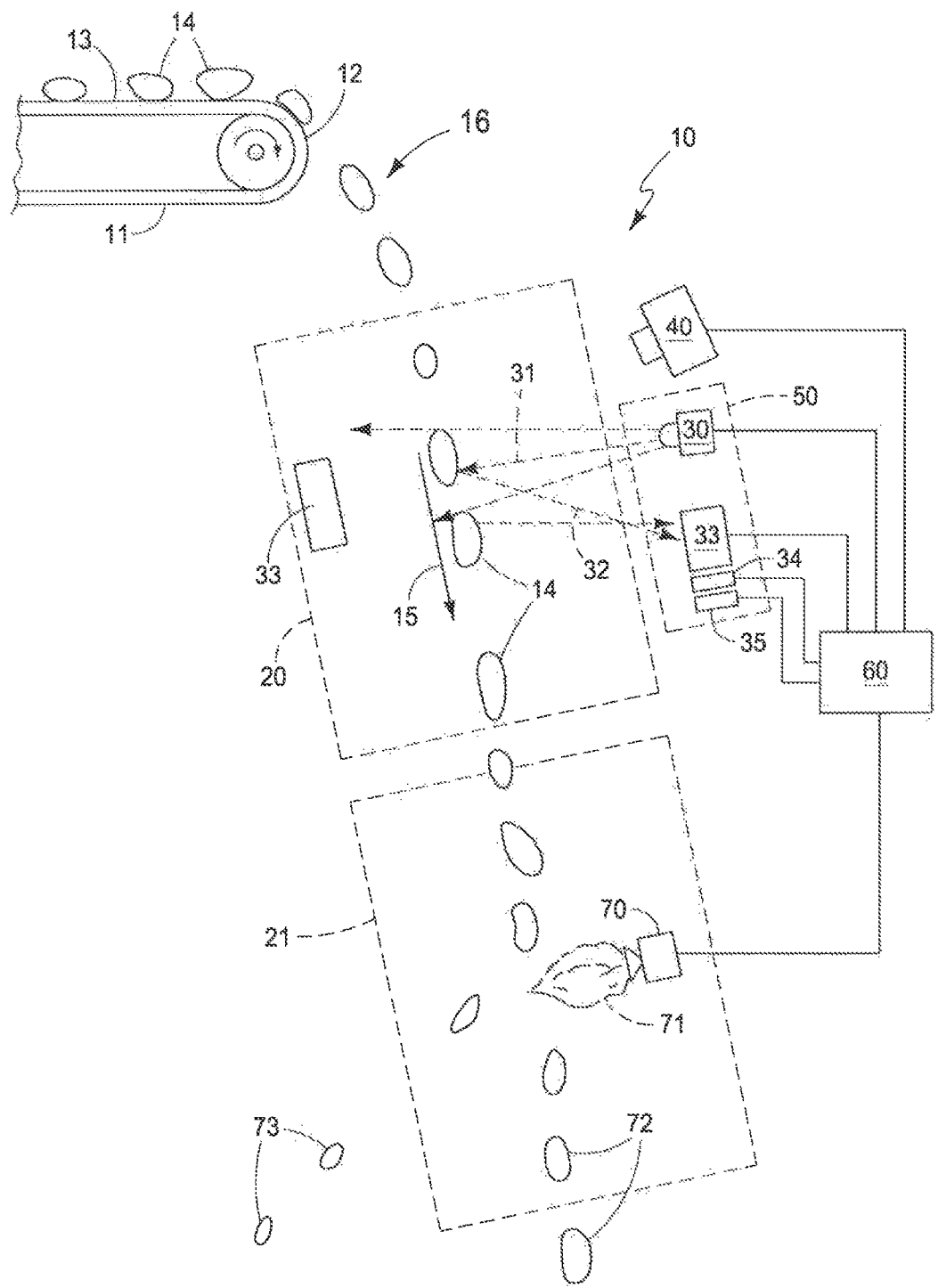
FIG. 1 is a greatly simplified, partial, schematic view of a sorting apparatus employing the present invention.

The sorting apparatus of the present invention is generally indicated by the numeral 10 in FIG. 1, and following. In this regard, and referring now to FIG. 1, the sorting apparatus 10 is generally depicted in this greatly simplified, schematic view. The sorting apparatus 10 includes a conveying device which is generally indicated by the numeral 11. The conveying device 11 has a distal end 12. Still further, the conveying device has an upwardly facing supporting surface 13, and which supports objects of interest and/or products to be inspected and sorted, 14, and which are further released for travel, under the influence of gravity, on a downwardly directed path of travel 15. The downwardly directed path of travel passes or moves through an inspection station 20, and a further, downstream, defect removal station which is generally indicated by the numeral 21.

The product stream 16 which is traveling along the downwardly directed path of travel 15, moves or passes by, an electromagnetic generation assembly which is generally indicated by the numeral 30. This assembly is further located laterally, outwardly relative to both the inspection station 20, and the product stream 14 which is moving along the path of travel 15. The electromagnetic radiation generation assembly, when energized, generates a predetermined band of electromagnetic radiation 31, and which further is emitted in the direction of the inspection station 20. The emitted electromagnetic radiation 31 is further reflected, at least in part, from the objects of interest or products 14 which are moving along in the product stream 16, and which are further passing through the inspection station 20. It should be understood that the emitted electromagnetic radiation 31 is reflected 32, at least in part, from the product stream 16 passing through the inspection station 20. The sorting apparatus 10 also includes an electromagnetic radiation detector 33 for detecting the electromagnetic radiation 31 which is emitted by the electromagnetic radiation assembly 30. In the present invention, the electromagnetic radiation detector 33 includes an avalanche photodiode (APD) 34 which is maintained at a predetermined temperature, and which further demonstrates, during operation, a higher gain, and signal-to-noise ratio with greater stability at the selected predetermined temperature. In the present invention, the APD 34 is selectively heated to a predetermined temperature, as discussed, below. However, it is possible that the APD 34 could be cooled, or reduced in temperature (relative to the surrounding ambient temperature) to achieve the same stability which is desired. This cooling, if implemented, would need to have sufficient cooling capacity so as to maintain the APD 34 at a given temperature which provides the higher gain, and signal-to-noise ratio desired. The sorting apparatus 10 may also include an image capturing device 40, of conventional design, and which is further operable to generate images of the individual objects of interest or products 14 that are moving along in the product stream 16, and which are further passing through the inspection station 20. The electromagnetic generation assembly 30, as well as the electromagnetic radiation detector 33, the APD 34, and a photomultiplier tube (PMT) 35 may optionally be combined into a laser scanner which is generally indicated by the numeral 50. The laser scanner 50 when rendered operable generates an emitted beam of electromagnetic radiation 31 that moves along a given path of travel (not shown) through the inspection station 20 so as to optically inspect the individual objects of interest or products 14 which are passing through the inspection station 20. As seen in FIG. 1, the electromagnetic generation assembly 30, the electromagnetic radiation detector 33, which in the present invention takes on the form of the APD 34, and PMT 35, are each controllably coupled to a controller, and which is generally indicated by the numeral 60. The controller 60 synchronously operates the aforementioned components so as to optically interrogate the individual objects of interest or products 14 which are passing through the inspection station 20. The controller 60 is operably controllably coupled to a prior art ejector, and which is generally indicated by the numeral 70. The ejector typically takes on the form of a selectively operable air manifold. The ejector 70 is provided with an electrical signal from the controller 60 so as to release a source of pressurized air 71 which is effective in deflecting or propelling objects of interest or products 14 which are traveling in the product stream 16, out of the product stream, so that unacceptable objects of interest or products are removed. This action of the ejector 70 forms a resulting acceptable product stream 72, and an unacceptable product stream, and which is generally indicated by the numeral 73.

Figure 2:
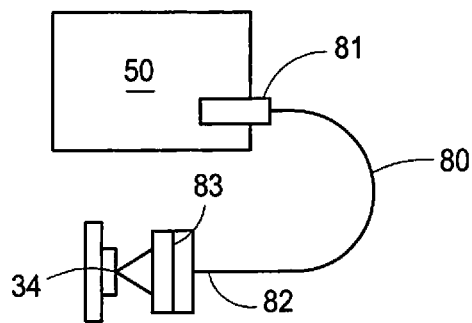
FIG. 2 is a greatly simplified, schematic view of the present invention employing a fiber optic conduit, and which is coupled to a prior art laser scanner, and with an APD as described in the present invention.
Figure 3:
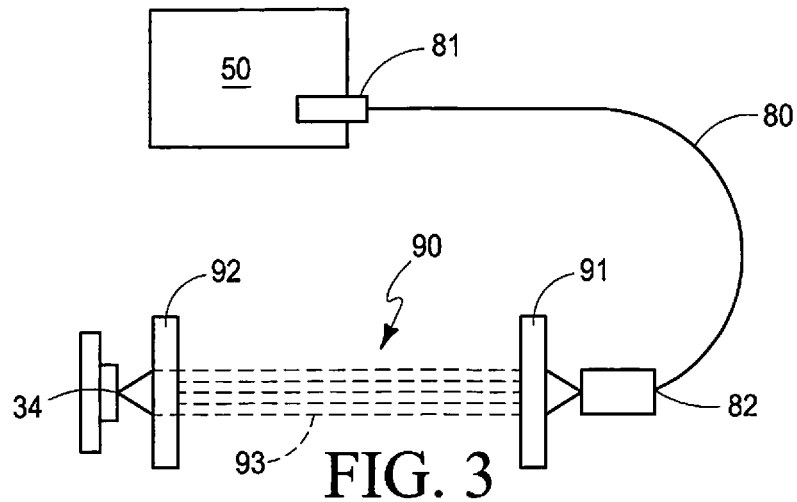
FIG. 3 is a greatly simplified, schematic view of an arrangement where a fiber optic conduit is coupled in operable combination with an APD by using a collimated space, and which is located between the fiber optic cable and the APD.
Figure 4:
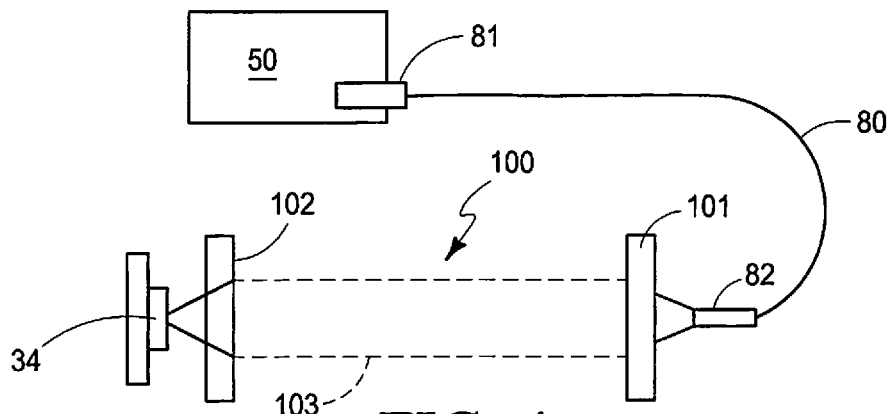
FIG. 4 is a greatly simplified, schematic view showing a fiber optic conduit coupled in operable combination with an APD, and by means of a free-space located between the fiber optic cable or conduit, and the APD.

The sorting apparatus 10, of the present invention, and as noted above, includes an APD 34, and which is optically coupled to a laser scanner 50. As seen in FIG. 2, and in one form of the invention, this optical coupling of the ADP 34 to the laser scanner 50 may be achieved by a fiber optic conduit 80. The fiber optic conduit has a first end 81 which is received, and operably coupled to the laser scanner 50, and an opposite, second end 82, and which is further disposed in optical transmitting relation relative to a suitable optical element 83. The optical element 83 receives the emitted electromagnetic radiation 31, and then further projects it, or otherwise directs it onto an operable surface of the APD 34. In a second form of the invention, the APD 34 is optically coupled to a collimated space 90 which is established between the ADP 34, and the laser scanner 50. This is best seen by reference to FIG. 3. In this regard the fiber optic conduit 80, and more specifically the second end 82, thereof, is positioned in optical transmitting relation relative to a first optical element 91. The first optical element 91 then transmits or otherwise passes the emitted electromagnetic radiation 31, in a collimated beam 93 which is then received by a second optical element 92, and which is spaced a given distance from the first optical element 91. The second optical element 92, again, passes the emitted electromagnetic radiation 31, and then focuses or otherwise directs the emitted electromagnetic radiation onto an operational surface the APD 34. The emitted electromagnetic radiation which is collimated, and passed between the first and second optical elements 91 and 92, is indicated by the numeral 93 in FIG. 3. In one possible form of the invention, not shown, one or more dichroic optical filters, (not shown) and which could be placed in the collimated beam 93, and then be rendered operable to select desired wavelengths of electromagnetic radiation in the collimated beam, and which would send the selected wavelengths of electromagnetic radiation onto one or more other APDs 34. Further the laser scanner may be optically coupled to the APD 34 by way of a free space transmission (FIG. 4), and which is generally indicated by the numeral 100. Again, the fiber optic conduit 80, and more specifically the second end 82, is positioned in optical transmitting relation relative to a first optical element 101. The first optical element 101 passes or transmits the emitted electromagnetic radiation to a second optical element 102. The emitted electromagnetic radiation 103 which passes between the first and second optical elements 101 and 102 is indicated by the numeral 103. Free space transmission is well known in the art. Again, the second optical element 102 focuses or otherwise passes the emitted electromagnetic radiation 103, and directs it onto an operational surface of the APD 34.

As noted above, the present invention 10, and more specifically the selectively heated avalanche photodiode (ADP) 34 is maintained at a predetermined elevated temperature and which, when maintained at that temperature demonstrates or produces a higher gain, and signal-to-noise ratio, with greater stability, at the predetermined elevated temperature. More specifically, the predetermined temperature is substantially constant, and elevated above a predetermined maximum ambient temperature. In this regard the predetermined temperature of the APD 34 is about 43.5° C. Further the predetermined maximum ambient temperature is about 40° C.

Figure 5:
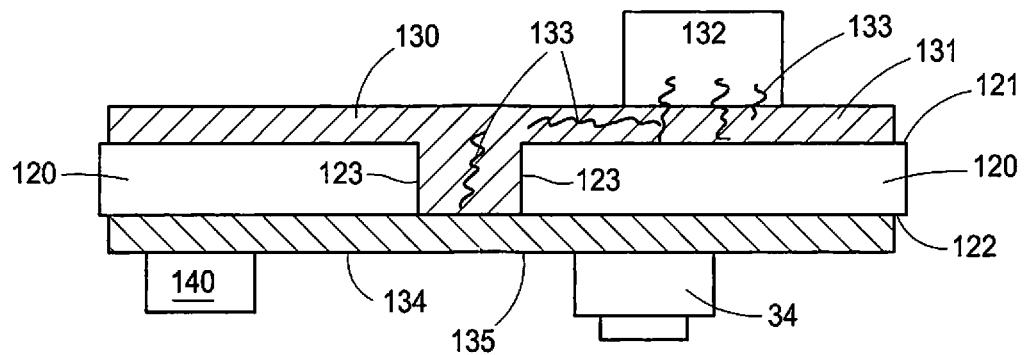
FIG. 5 is a greatly exaggerated, transverse, sectional view taken through a printed circuit board showing some of the features of the present invention.

The sorting apparatus 10 of the present invention, and which includes the APD 34, further has a printed circuit board 120, and which has top and bottom surfaces 121 and 122, respectively. As seen in FIG. 5, at least one via or passageway 123 is formed in the printed circuit board, and further extends between the top and bottom surfaces 121 and 122, respectively. In addition to the foregoing, a first layer of a heat conducting material, such as copper, forming a heat sink, 130, is deposited or formed on the top surface 121, of the printed circuit board. The first layer of heat conducting material 130 covers a given portion of the top surface 121, and further extends, at least in part, through the at least one via or passageway 123, so as to communicate with the bottom surface 122. As illustrated in FIG. 5, a field effect transistor (FET) 132 is mounted on the top surface 131 of the first layer of heat conducting material 130, and which further operates as a heat sink 130. The FET 132 is electrically coupled with an electrical control circuit which will be discussed in greater detail, below. It should be appreciated that the FET 132 is operably mounted on the heat sink 130, and is further selectively energized by the electrical circuit, which will be discussed, below, so as to generate heat energy 133, and which further is received, and conductively transmitted by the heat sink 130. As noted, above, the first layer of heat conducting material forming the heat sink 130, extends, at least in part, through the vias 123, and further transmits the heat energy 133, at least in part, to the bottom surface 122 of the printed circuit board 120. As should be understood, the APD 34 is mounted or operably coupled to the bottom surface 122, and the heat energy generated by the field effect transistor 132 is conductively transmitted through the vias 123 to the APD 34, thereby maintaining the temperature of the APD 34 substantially constant, and about at 43.5° C. As seen in FIG. 5, a second layer of heat conducting material, and which is typically formed of copper, is deposited on the bottom surface 122 of the printed circuit body 120. The second layer of heat conducting material 134, and which forms a second heat sink, is coupled in heat receiving relation relative to the first layer of heat conducting material 130. Therefore, heat energy 133 which is transmitted into the first layer of heat conducting material 130 by the FET 132 is transmitted to the second layer of heat conducting material 134. As will be recognized by a study of FIG. 5, the APD 34 is mounted on, or otherwise coupled in heat receiving relation relative to the second layer of heat conducting material 134. It should be appreciated that the heat energy 133 which is provided by the FET 132 keeps the APD 34 at the desired, and predetermined elevated temperature as referenced, above. The second layer of heat conducting material 134 has an outwardly facing surface 135, and which supports the APD 34, and other structures which will be discussed, below.

Figure 6:
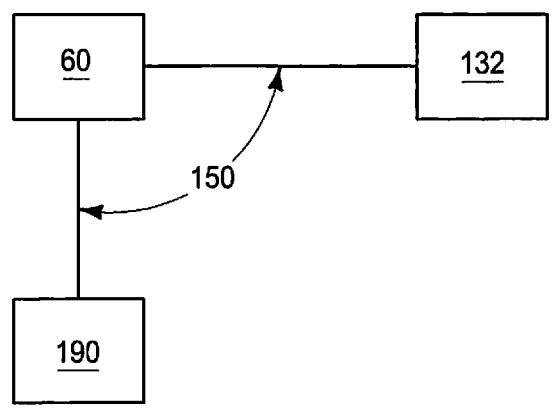
FIG. 6 is a greatly simplified, schematic view of an electrical circuit which finds usefulness in the present invention.
Figure 5:
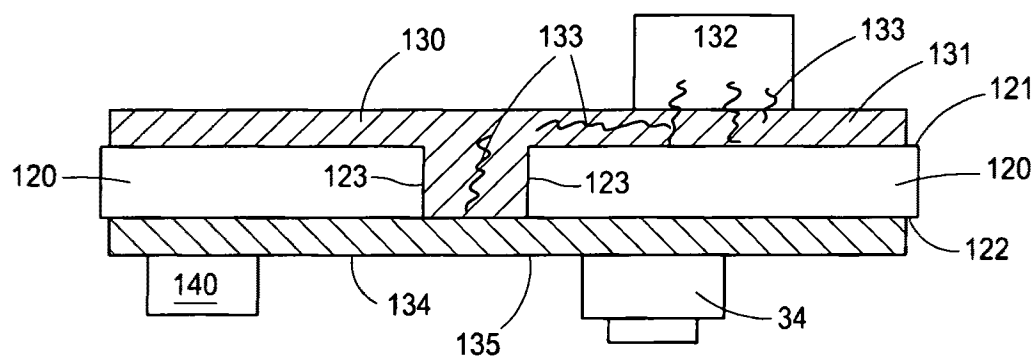
Figure 6:
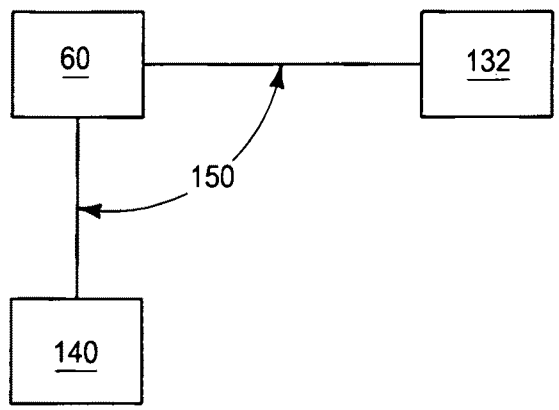

The sorting apparatus 10, of the present invention further includes a temperature sensor which is seen in the very simplified, schematic view of FIG. 6. The temperature sensor 140 is mounted, as seen in FIG. 5, in heat sensing relation relative to the second layer 134, of the heat conducting material, and which is deposited on the bottom surface 122, of the printed circuit board 120. An electrical circuit 150, and which is operably coupled to the controller 60, is further operably coupled with each of the field effect transistor 132, and the temperature sensor 140. The electrical circuit 150 selectively, electrically energizes the transistor 132 so as to cause the transistor 132 to generate a sufficient amount of heat energy 133, and which is imparted to the first layer of heat conductive material 130, and which is subsequently conductively transmitted to the second layer of heat conducting material 134. The heat energy 133 maintains the APD 34 at the predetermined, elevated temperature noted, above. As indicated earlier, the field effect transistor 132 is typically mounted on the first heat conducting layer 130. Typically each of the heat conducting layers 130 and 134, are fabricated, at least in part, from copper. Further, the first and second layers of heat conducting material 130 and 134 are oriented so as to not be in heat conductive and/or transmitting relation relative to other assemblies that would be present in a typical laser scanner 50. The electrical circuit 150 is electrically coupled to and controlled by the controller 60 as seen in FIG. 6.

OPERATION

The operation of the described embodiment of the present invention is believed to be readily apparent and is briefly summarized at this point.

In its broadest aspect the present invention relates to an electrical device which produces an electrical signal, and which is maintained at a predetermined temperature, and which further demonstrates a higher gain, and signal-to-noise ratio with greater stability, at the selected, predetermined temperature, and which further is unaffected in its performance by a surrounding, environmental ambient temperature.

The sorting apparatus 10 of the present invention includes, as a first aspect an inspection station 20 for receiving a product stream 16 which is to be sorted. The sorting apparatus 10 further includes an electromagnetic radiation generating assembly 30 which is positioned adjacent to the inspection station 20, and which, when energized, generates a predetermined band of electromagnetic radiation 31, and which further is emitted in the direction of the inspection station 20. The emitted electromagnetic radiation 31 is reflected, at least in part, from the product stream 16 passing through the inspection station 20. The sorting apparatus 10 further includes an electromagnetic radiation detector 33 for detecting the electromagnetic radiation 31, and which is emitted by the electromagnetic radiation generating assembly 33. The electromagnetic radiation detector 33 includes, in one form of the invention, a selectively heated avalanche photodiode (APD) 34, and which is maintained at a predetermined, substantially constant temperature, and which further is greater than a given, ambient temperature. The APD 34 demonstrates a higher gain, and signal-to-noise ratio with greater stability, at the predetermined, elevated, substantially constant temperature. The APD 34 is made integral with a printed circuit board 120 having top and bottom surfaces 121 and 122, respectively. A first layer of a heat conducting material 130 is deposited on the top surface 121 of the printed circuit board 120. A transistor 132 is operably mounted on the first layer of the heat conducting material 130, and is selectively energized. The transistor 132 when selectively energized generates heat energy 133, and which is received and then conductively transmitted by the first layer of heat conducting material 130, by way of the vias 123, and which are formed in the printed circuit board 120, to the bottom surface 122 of the printed circuit board 120. As seen in the drawings, the first layer of heat conductive material 130 extends through the vias 123, and transmits the generated heat energy 133, at least in part, to the bottom surface 122. Still further, the APD 34 is mounted on the bottom surface 122, of the circuit board 120, and the heat energy 133 which is generated by the transistor 130, is conductively transmitted through the vias 123 to the APD 34. The sorting apparatus 10 of the present invention includes a temperature sensor 140, and which is mounted in heat sensing relation relative to the second layer of heat conducting material 134, and which maintains the APD 34 at the predetermined, substantially constant, and elevated temperature which is greater than a given maximum ambient temperature. The sorting apparatus 10 further includes a controller 60 which is operably and controllably coupled to each of the electromagnetic radiation generating assembly, APD 34, temperature sensor 140, and electrical circuit 150, respectively. As earlier discussed, the predetermined, substantially constant temperature of the APD is maintained at a temperature of substantially about 43.5° C. Further, the predetermined maximum ambient temperature is about 40° C. The sorting apparatus 10 of the present invention, in one form, further includes a photomultiplier tube (PMT) 35, which detects the electromagnetic radiation 31 which is emitted by the electromagnetic radiation generating assembly 30. In the present invention the APD 34 has a main body, and an electrical ground; and the electrical circuit 150 also has an electrical ground. In the arrangement as seen in the drawings, each of the aforementioned electrical grounds of the APD 34, and electrical circuit 150, are coupled to the body of the APD. In this arrangement the invention 10 operates in a manner where the noise generated by each of the APD 34, electrical circuit 150 is reduced, thereby enhancing the operation of the present invention.

Therefore, it will be seen that the present invention provides a convenient means whereby an automated, high-speed sorting apparatus can be rendered much more effective to detect selective bands of reflective electromagnetic radiation reflected from a product stream so as to allow the sorting apparatus to achieve sorting efficiencies and accuracies not possible heretofore.

In compliance with the statute the invention has been described in language more or less specific as so structural and methodical features. It is to be understood, however that the invention is not limited to the specific features shown and described since the means herein disclosed comprise preferred forms of putting the invention into effect. The invention is, therefore, claimed in any of its forms of modifications within the proper scope of the appended claims, appropriately interpreted in accordance with the Doctrine of Equivalence.

We claim:

1. A sorting apparatus comprising:
    an inspection station for receiving a product stream which is to be sorted;
    an electromagnetic radiation assembly positioned adjacent to the inspection station, and which, when energized, generates a predetermined band of electromagnetic radiation, and which further is emitted in the direction of the inspection station, and wherein the emitted electromagnetic radiation is reflected, at least in part, from the product stream passing through the inspection station;
    an electromagnetic radiation detector for detecting the electromagnetic radiation which is emitted by the electromagnetic radiation assembly, and wherein the electromagnetic radiation detector includes an avalanche photodiode (APD) which is maintained at a predetermined temperature, and which further demonstrates a higher gain, and signal-to-noise ratio with greater stability at the predetermined temperature; and wherein the electromagnetic radiation assembly, and detector are made integral with a laser scanner;
    a controller operably and controllably coupled to each of the electromagnetic radiation assembly, and detector, respectively; and
wherein the sorting apparatus further comprises a photomultiplier tube (PMT) which detects the electromagnetic radiation emitted by the electromagnetic radiation assembly.

2. A sorting apparatus as claimed in claim 1, and wherein the APD is optically coupled to the laser scanner by a fiber optic conduit; a collimated space established between the APD and the laser scanner; and/or a free-space transmission established between the APD, and the laser scanner.

3. A sorting apparatus as claimed in claim 1, and wherein the predetermined temperature of the APD is substantially constant, and about 43.5 degrees C.

4. A sorting apparatus as claimed in claim 1, and wherein the predetermined maximum ambient temperature is about 40 degrees C.

5. A sorting apparatus as claimed in claim 1, and wherein the APD further comprises a printed circuit board having top and bottom surfaces, and wherein a first layer of a heat conducting material forming a heat sink is deposited on the top surface, and a transistor is operably mounted on the heat sink, and is selectively energized, so as to generate heat energy which is received, and conductively transmitted by the heat sink, and wherein vias are formed in the printed circuit board, and extend between the top and bottom surfaces of the printed circuit board, and wherein the first layer of heat conductive material forming the heat sink extends through the vias, and transmits the heat energy, at least in part, to the bottom surface, and wherein the APD is mounted on the bottom surface, and the heat energy generated by the transistor is conductively transmitted through the vias, to the APD.

6. A sorting apparatus as claimed in claim 5, and wherein a second layer of heat conductive material is positioned on the bottom surface of the printed circuit board, and wherein the vias are coupled in heat conducting transmission relative to the second layer of heat conductive material, and the APD is mounted on the second layer of heat conductive material.

7. A sorting apparatus as claimed in claim 6, and further comprising:
a temperature sensor mounted in heat sensing relation relative to the second layer of heat conductive material; and
an electrical circuit operably and controllably coupled with each of the transistor, and the temperature sensor, and which electrically energizes the transistor so as to cause the transistor to generate a sufficient amount of heat energy which is imparted to the first layer of heat conducting material, and which is further conductively transmitted to the second layer of heat conducting material, and wherein the heat energy maintains the APD at the predetermined temperature.

8. A sorting apparatus as claimed in claim 7, and wherein the transistor is a field effect transistor, and the first and second heat conducting layers are fabricated, at least in part, from copper.

9. A sorting apparatus as claimed in claim 8, and wherein the predetermined band of electromagnetic radiation generated by the laser scanner is formed into a bean which defines a flying spot, and which repeatedly moves along a given path of travel through the inspection station.

10. A sorting apparatus as claimed in claim 9, and wherein the first and second layers of heat conductive material are oriented so as to not be in heat conductive and transmitting relation relative to another, adjacent assembly.

11. A sorting apparatus, comprising:
an inspection station for receiving a product stream which is to be sorted;
an electromagnetic radiation assembly positioned adjacent to the inspection station, and which, when energized, generates a predetermined band of electromagnetic radiation, and which further is emitted in the direction of the inspection station, and wherein the emitted electromagnetic radiation is reflected, at least in part, from the product stream passing through the inspection station;
an electromagnetic radiation detector for detecting the electromagnetic radiation which is emitted by the electromagnetic radiation assembly, and wherein the electromagnetic radiation detector includes a selectively heated avalanche photodiode (APD) which is maintained at a predetermined substantially constant temperature which is greater than a given maximum ambient temperature, and which further demonstrates a higher gain, and signal-to-noise ratio, with greater stability at the predetermined substantially constant temperature, and wherein the APD is made integral with a printed circuit board having top and bottom surfaces, and wherein a first layer of a heat conductive material is deposited on the top surface of the printed circuit board, and a transistor is operably mounted on the first layer of heat conductive material, and is selectively energized, and wherein the transistor, when selectively energized, generates heat energy which is received, and conductively transmitted by the first layer of heat conductive material, and wherein vias are formed in the printed circuit board, and extend between the top and bottom surfaces of the printed circuit board, and the first layer of heat conductive material extends through the vias, and transmits the generated heat energy, at least in part, to the bottom surface, and wherein the APD is mounted on the bottom surface of the printed circuit board, and the heat energy generated by the transistor is conductively transmitted through the vias, to the APD;
a temperature sensor mounted in heat sensing relation relative to the second layer of heat conductive material;
an electrical circuit operably, and controllably coupled with each of the transistor, and the temperature sensor, and wherein the electrical circuit selectively, electrically energizes the transistor so as to cause the transistor to generate a sufficient amount of heat energy which is imparted to the first layer of heat conductive material, and then conductively transmitted to the second layer of heat conductive material, and which maintains the APD at the predetermined substantially constant temperature which is greater than a given maximum ambient temperature; and
a controller operably and controllably coupled to each of the electromagnetic radiation assembly, APD, temperature sensor, and electrical circuit, respectively.

12. A sorting apparatus as claimed in claim 11, and wherein and wherein the predetermined substantially constant temperature of the APD is about 43.5 degrees C.

13. A sorting apparatus as claimed in claim 11, and wherein the predetermined maximum ambient temperature is about 40 degrees C.

14. A sorting apparatus as claimed in claim 11, and wherein the sorting apparatus further comprises a photomultiplier tube (PMT) which detects the electromagnetic radiation emitted by the electromagnetic radiation assembly.

15. A sorting apparatus as claimed in claim 11, and wherein the APD is optically coupled to the laser scanner by a fiber optic conduit; a collimated space established between the APD and the laser scanner; and/or a free-space transmission established between the APD, and the laser scanner.

16. A sorting apparatus as claimed in claim 11, and wherein the APD has a main body and a ground, and the electrical circuit has a ground, and wherein each ground is coupled to the body of the APD, and operates in a manner to reduce the noise generated by each of the APD and electrical circuit.

* * * * *

UNITED STATES PATENT AND TRADEMARK OFFICE
CERTIFICATE OF CORRECTION

PATENT NO.        : 10,449,573 B2
APPLICATION NO.   : 15/634137
DATED             : October 22, 2019
INVENTOR(S)       : Johan Calcoen and Peter Stulens Page 1 of 2

It is certified that error appears in the above-identified patent and that said Letters Patent is hereby corrected as shown below:

In the Drawings

Please replace FIGS. 5 and 6 with FIGS. 5 and 6 as shown on the attached pages.

Signed and Sealed this
Seventeenth Day of December, 2019

Andrei Iancu
*Director of the United States Patent and Trademark Office*